United States Patent [19]

Kanda et al.

[11] Patent Number: 4,913,769

[45] Date of Patent: Apr. 3, 1990

[54] PROCESS FOR PREPARING SUPERCONDUCTIVE WIRING BOARD

[75] Inventors: Naoya Kanda, Yokohama; Takayoshi Sowa, Fujisawa; Tetsuya Yamazaki; Hiroaki Okudaira, both of Yokohama, all of Japan

[73] Assignee: Hitachi, Ltd., Tokyo, Japan

[21] Appl. No.: 228,297

[22] Filed: Aug. 4, 1988

[30] Foreign Application Priority Data

Aug. 24, 1987 [JP] Japan ................... 62-208107
Sep. 18, 1987 [JP] Japan ................... 62-232117
Oct. 30, 1987 [JP] Japan ................... 62-272950

[51] Int. Cl.$^4$ .................. B44C 1/22; C03C 15/00; C03C 25/06; C23F 1/00
[52] U.S. Cl. .................. 156/652; 156/655; 156/656; 156/659.1; 156/661.1; 156/666; 204/192.24; 505/816; 505/820; 427/63
[58] Field of Search ............... 156/633, 634, 652, 655, 156/656, 659.1, 661.1, 666, 667, 668; 427/62, 63; 204/192.24; 505/816, 820; 252/79.1, 79.5

[56] References Cited

U.S. PATENT DOCUMENTS 4,075,756 2/1978 Kircher et al. ................ 427/63 X
4,589,961 5/1986 Gershenson .................... 427/63 X

OTHER PUBLICATIONS

Nikkei Electronics, published by Nikkei-McGraw-Hill Co., Jun. 17, 1985, pp. 243-266. (Japanese-No English Translation Available).
Japanese Journal of Applied Physics, vol. 26, No. 5, May 1987, pp. L709-L710. (English).
Japanese Journal of Applied Physics, vol. 26, No. 5, May 1987, pp. L738-L740. (English)

*Primary Examiner*—William A. Powell
*Attorney, Agent, or Firm*—Fay, Sharpe, Beall, Fagan, Minnich & McKee

[57] ABSTRACT

The present invention relates to an element comprising a superconductive material or a wiring formation technique. In a thin film wiring board in which a superconductive material is used as a conductor, annealing should be conducted at a high temperature in an oxygen atmosphere after formation of a film in order to convert the conductor portion into a superconductive material, which makes it necessary to use an inorganic oxide as the insulating film. This brought about a problem that the etching of the second and subsequent insulation layers causes a damage to the wiring and insulation layer provided thereunder.

In the present invention, an over-etching preventing layer is provided on a wiring layer provided under the second and subsequent insulation layers in order to solve the problem in question.

The present invention brings about an effect of realizing the formation of a multi-layered wiring layer by making use of a superconductive material.

8 Claims, 3 Drawing Sheets

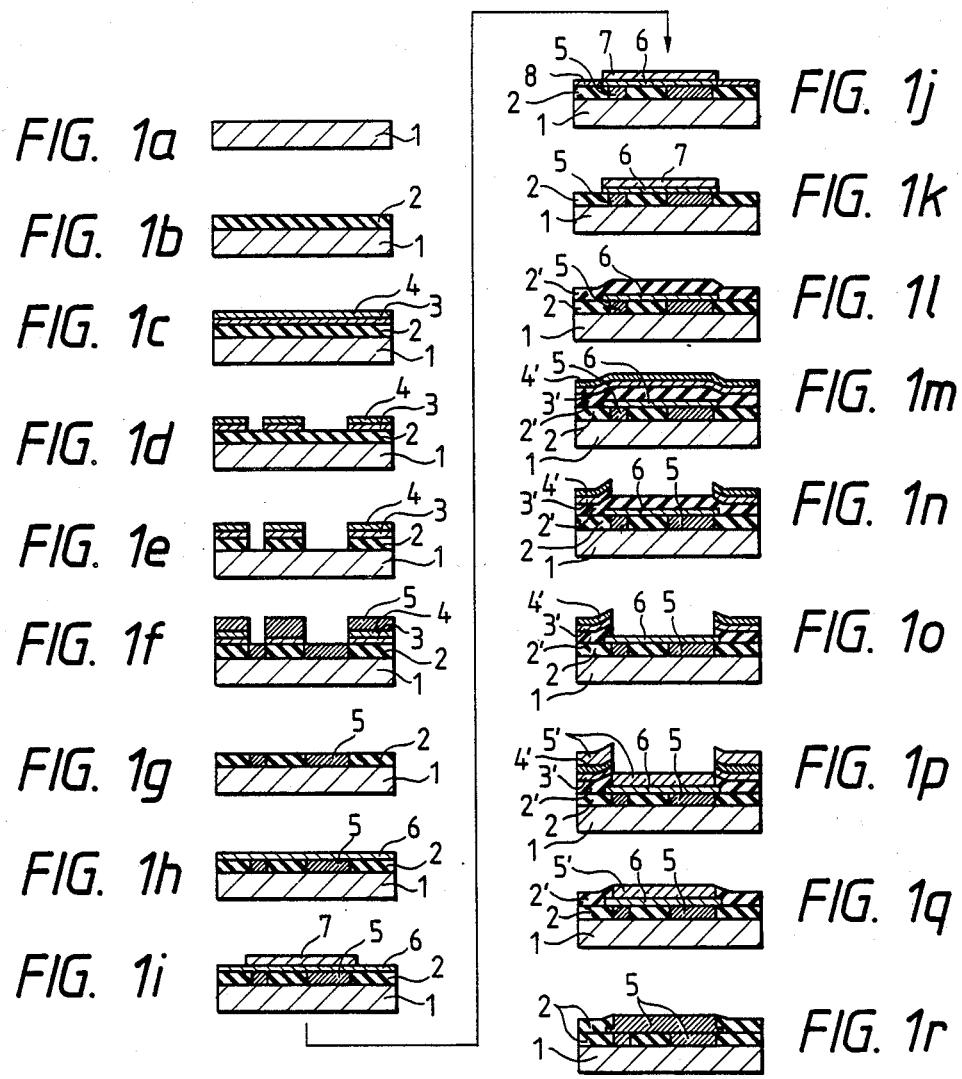

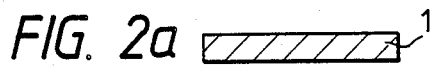
FIG. 2a
FIG. 2b
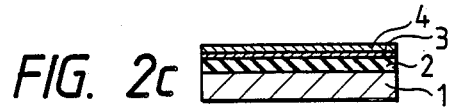
FIG. 2c
FIG. 2d
FIG. 2e
FIG. 2f
FIG. 2g
FIG. 2h
FIG. 2i
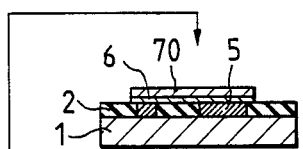
FIG. 2j
FIG. 2k
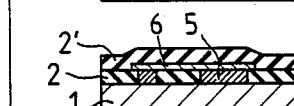
FIG. 2l
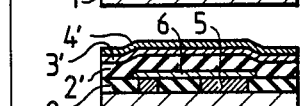
FIG. 2m
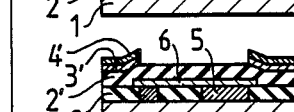
FIG. 2n
FIG. 2o
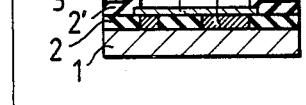
FIG. 2p
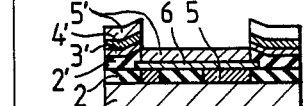
FIG. 2q

PROCESS FOR PREPARING SUPERCONDUCTIVE WIRING BOARD

BACKGROUND OF THE INVENTION

The present invention relates to a technique of forming a circuit and wiring in which a superconductive material is used and particularly to a process suited for forming a three-dimensional integrated circuit and wiring.

In the conventional thin film multi-layered substrate process using Cu-polyimide, a polyimide resin is used for the purpose of interlayer insulation. The patterning of the polyimide film is conducted by applying a polyimide resin solution, drying the resulting coating to remove the solvent, forming a resist layer, and conducting etching with an organic solvent. The patterned polyimide film is one prepared by heating to conduct exocondensation of the imide ring and therefore cannot be etched any more with an organic solvent. For this reason, the patterning of the second and subsequent layers each made of polyimide with a solvent brings about no damage to the polyimide constituting the lower layers. It is a matter of course that Cu which is a conductor is not damaged during this process.

On the other hand, in a thin film multi-layered wiring board in which a superconductive material is used as the conductor, annealing should be conducted at 400° C. or above in an oxygen atmosphere after the formation of a film in order to convert the conductive portion into a superconductive material, which makes it impossible to use polyimide as the insulation film. The use of an inorganic oxide as the insulating film is considered as an expedient for overcoming this drawback. However, when an inorganic material is used, an acid, an alkali, or the like should be used in etching, which unfavorably brings about a drawback that the etching of the second and subsequent insulation layers causes a damage to the wiring layer and insulation layer provided thereunder.

With respect to prior art, Cu-polyimide multi-layered wiring is described in Nikkei Electronics published by Nikkei-McGraw-Hill Co., June 17, 243-266 (1985). Further, Japanese Journal of Applied Physics, Vol. 26, No. 5, p.p. L709–L710 and p.p. L738–L740 describes the preparation of a superconductive thin oxide film.

In the above-described prior art, no consideration is given to the formation of a multi-layered wiring board in which a superconductive material is used as the wiring conductor. This brought about a problem that the etching of the second and subsequent insulation layers caused a damage to the insulation layer and wiring layer provided thereunder.

SUMMARY OF THE INVENTION

A first object of the present invention is to provide a process for preparing a superconductive wiring board in which the etching of the second and subsequent insulation layers brings about no damage to the insulation layer and wiring layer provided thereunder.

A second object of the present invention is to provide a process which enables not only the attainment of the above-described first object but also the preparation of a wiring board capable of preventing the deterioration of conductive characteristics of the wiring.

In order to attain the above-described objects, the present invention is characterized in that a flat layer containing the first wiring is formed before an over-etching preventing thin film is formed at the portions corresponding to etching portions of the upper layer.

In the manufacturing process of a wiring board, the use of an oxide of at least one member selected from among groups Ia and IIa elements as the insulation layer enables etching with an aqueous acid solution because the insulation layer is resistant to an aqueous alkali solution. In the etching of the second and subsequent insulation layers, it is necessary to provide an over-etching preventing layer in order to prevent the etching of the insulation layer provided thereunder. A metallic thin film comprising at least one of group Ib elements such as Cu which is an element constituting a superconductive material is used as the over-etching preventing layer.

The patterning of an over-etching preventing layer will now be described.

A first patterning method is as follows. A group 1b element is relatively stable against an acid and alkali and therefore can be used as the over-etching preventing layer. A resist having high oxygen plasma resistance is used for the patterning of the over-etching preventing layer to expose the portions to be etched, and the group 1b element present in the portions to be etched is oxidized to solubilize the portions to be etched in an aqueous solution containing ammonium ions, thereby conducting the patterning of the over-etching preventing layer without causing any damage to the insulation layers provided thereunder. This eliminates a problem accompanying the patterning of the second and subsequent insulation layers that the insulation layers provided under the insulation layer to be etched are damaged.

After the flat layer containing a wiring portion is formed, a Cu film is formed thereon, and an oxidation preventing resist is formed at the portions to be left as a pattern. Thereafter, the film is placed in an oxygen plasma or other oxidizing atmosphere to convert the exposed Cu into CuO. In order to remove the oxidized layer by etching, it is necessary for only CuO to be etched without causing etching of the inorganic compound constituting the insulation layers provided under the portion to be etched. CuO is converted into Cu(OH)$_2$ when brought into contact with an alkali solution and forms a complex when brought into contact with a concentrated alkali solution or an aqueous solution containing ammonium ions (a copper hydroxo complex in the case of contact with an alkali and a copper ammine complex in the case of contact with an aqueous solution containing ammonium ions) and therefore is eluted. However, since the oxide of the group IIa or IIIa element used for the insulation layer cannot be eluted even when brought into contact with an alkali solution, it is possible to conduct selective etching of CuO. In the above-described process, there is formed a Cu film which serves as an over-etching preventing layer in the patterning of the second and subsequent insulation layers by etching with an acid. Thereafter, the resist is peeled off with an organic solvent or the like, followed by formation of a film comprising an insulating inorganic compound as an upper insulation layer. Further, an acid-resistant film and a lift-off layer are formed on the portion to be left as an insulating portion, and the insulating inorganic compound layer is etched with an acid. At this time, the above-described Cu film functions as the over-etching preventing layer. A film of a superconductive material is then formed on the board thus prepared, followed by lift-off to form a flat second wiring layer.

The second method of patterning of the over-etching preventing layer will now be described.

Cu is relatively stable against an acid and therefore can be used as an over-etching preventing layer. A resist insoluble in an alkali is used for the patterning of the over-etching preventing layer to expose the portions to be etched, and Cu present in the exposed portions is etched with an alkaline etching solution, thereby effecting patterning of the over-etching preventing layer without giving any damage to the insulation layers provided thereunder. This eliminates a problem accompanying the patterning of the second and subsequent insulation layers that the insulation layers provided under the insulation layer to be etched is damaged.

After the flat layer containing a wiring portion is formed, a Cu film is formed thereon, and an alkali-insoluble resist is then formed at the portions to be left as a pattern. In order to remove the Cu film by etching, it is necessary for only Cu to be etched without causing etching of the inorganic compound constituting the insulation layers provided under the portion to be etched. It is possible to conduct etching of Cu with an alkaline etching solution (e.g., an etching solution comprising $NH_4ClO_2$, $NH_4Cl$, $(NH_4)_2CO_3$, and aqueous ammonia). On the other hand, since the oxide of the group IIa or IIIa element used for the insulation layer cannot be eluted even when brought into contact with an alkali solution, it is possible to conduct selective etching of Cu.

Thus, in the above-described process, there is formed a Cu film which serves as an over-etching preventing layer in the patterning of the second and subsequent insulation layers by etching with an acid. Thereafter, the resist is peeled off with an organic solvent or the like, followed by formation of a film comprising an insulating inorganic compound as an upper insulation layer. Further, an acid-resistant film and a lift-off layer are formed on the portion to be left as an insulating portion, and the insulating inorganic compound layer is etched with an acid. At this time, the above-described Cu film functions as the over-etching preventing layer. A film of a superconductive material is then formed on the board thus prepared, followed by lift-off to form a flat second wiring layer.

In order to convert the above-described over-etching etching preventing layer into a superconductive material, it is necessary to supplement the elements besides Cu which are required for constituting a superconductive material. The Cu and supplemented elements are then oxidized and then annealed. For this purpose, the upper insulation layer is formed, and the wiring portion is etched to expose the thin Cu film. Then, on the exposed thin Cu film is formed a thin film comprising at least one element constituting a superconductive material except for Cu, or a thin film comprising a superconductive material having a composition deficient in Cu or a precursor thereof, followed by formation of wiring of a superconductive material. After the completion of the lamination, the whole board is heated and annealed to oxidize the Cu film and the above-described thin film, thereby converting them into a superconductive material. In order to promote the oxidation of Cu and the above-described thin film, thermal oxidation or oxidation with an oxygen plasma may be conducted for each layer.

In the above-described process, there is formed a thin film of a superconductive material between the upper and lower wiring layers. This causes the thin Cu film of the over-etching preventing layer and the oxide thereof to be left between the wiring layers, which prevents the conductive characteristics from deteriorating. Further, this also prevents the breaking of wire caused by slippage of the upper and lower wiring layers.

BRIEF DESCRIPTION OF THE DRAWING

FIGS. 1a to 1r are each a process diagram illustrating the first example of the method according to the present invention wherein an oxide layer is formed and an over-etching preventing layer is then patterned;

FIGS. 2a to 2q are each a process diagram illustrating the second example of the method according to the present invention wherein an over-etching preventing layer is patterned with an alkaline etching solution.

DETAILED DESCRIPTION OF THE PREFERRED EMBODIMENTS

Figure 3A:
FIGS. 3a to 3r are each a process diagram illustrating the third example of the method according to the present invention wherein a thin film comprising at least one element constituting a superconductive material except for Cu or a superconductive material having a composition deficient in Cu is formed on an over-etching preventing layer.

The first example of the present invention will now be described with reference to FIGS. 1a to 1r. An insulation layer 2 which can be etched with an acid but is hardly etched with an alkali is formed on a substrate 1 (e.g., an oxide of at least one member selected from among the groups Ia and IIa elements, such as $Ba_4Y_2O_7$) by Ar sputtering (see FIG. 1b). Further, a lift-off layer 3 and an acid-resistant layer 4 are formed thereon (see FIG. 1c), followed by patterning by means of photolithography or the like (see FIG. 1d). The exposed portions of the insulation layer 2 are etched with an acid (see FIG. 1e), followed by formation of a superconductive material film or a film 5 having the composition of the superconductive material. It is preferred that the thickness of the film be equal to that of the insulation layer 2 (see FIG. 1f). The lift-off layer 3 is removed by the lift-off process or the like, thereby preparing a flat board (see FIG. 1g). Then, a thin Cu layer 6 which functions as an over-etching preventing layer is formed (see FIG. 1h). Further, an oxygen-resistant resist 7 is formed thereon, followed by patterning (see FIG. 1i). The resulting board is then exposed to an oxygen plasma to oxidize the exposed Cu layer, thereby forming a Cu oxide layer 8 (see FIG. 1j). Then, the board is immersed in an alkali solution or an alkali solution containing ammonium ions to selectively etch the Cu oxide layer 8 (see FIG. 1k). Thereafter, a second insulation layer 2' is formed (see FIG. 1l), and a lift-off layer 3' and an acid-resistant layer 4' are further formed thereon (see FIG. 1m), followed by patterning. As with the case of FIG. 1n, dry etching or solvent etching may be used for patterning. Thereafter, the exposed portions in the insulation layer 2' are etched with an acid to prepare an insulation layer having a desired shape (see FIG. 1o). In this step, the Cu layer 6 functions as an over-etching preventing layer, which prevents any damage to the wiring 5 and insulation layer 2 of the first layer. Thereafter, a film of a superconductive material or a film 5' of composition having the composition thereof is formed in the same manner as that of FIG. 1f (see FIG. 1p), and the lift-off layer 3' and layers provided thereover are removed by lift-off process or the like, thereby preparing a board having excellent flatness (see FIG. 1q). In the final step, the board is annealed in an atmosphere containing oxygen to oxidize the Cu layer 6 used as the over-etching preventing layer and, at the same time, to promote the reaction, thereby preparing a wiring board in which superconductive layers are electrically connected to each other (see FIG. 1r). In the above-described steps, the lift-off layers 3 and 3' and resist layers 4 and 4' may be the same material as far as the requirements for characteristics are met. Alternatively, a single layer having a combination of lift-off properties with acid-resistant properties may also be used. Further, in the annealing in the final step, a fluorine gas, an ammonium fluoride vapor, or the like may be introduced to cause partial fluorination, thereby preparing superconductive layers 5 and 5'. A multi-layered wiring board having two or more wiring layers can be formed by repeating the steps shown in FIGS. 1h to 1r.

The second example of the present invention will now be described with reference to FIGS. 2a to 2q. An insulation layer 2 which can be etched with an acid but is hardly etched with an alkali is formed on a substrate 1 (e.g., an oxide of at least one member selected from among the groups Ia and IIa elements, such as $Ba_4Y_2O_7$) by Ar sputtering (see FIG. 2b). Further, a lift-off layer 3 and an acid-resistant layer 4 are formed thereon (see FIG. 2c), followed by patterning by means of photolithography or the like (see FIG. 2d). The exposed portions of an insulation layer 2 are etched with an acid (see FIG. 2e), followed by formation of a superconductive material film or a film 5 having the composition of the superconductive material. It is preferred that the thickness of the film be equal to that of the insulation layer 2 (see FIG. 2f). The lift-off layer 3 is removed by lift-off process or the like, thereby preparing a flat board (see FIG. 2g). Then, a thin Cu layer 6 which functions as an over-etching preventing layer is formed (see FIG. 2h). Further, an alkaline-resistant resist 70 is formed thereon, followed by patterning (see FIG. 2i). Then, the Cu layer 6 is subjected to selective etching with an alkaline etching solution (e.g., an etching solution comprising 30 g/l of $NH_4ClO_2$, 100g/l, of $NH_4Cl$, 30 g/l of $(NH_4)_2CO_3$, and 150 g/l of aqueous ammonia) (see FIG. 2j). Thereafter, a second insulation layer 2' is formed (see FIG. 2k), and a lift-off layer 3' and an acid-resistant layer 4' are further formed thereon (see FIG. 2l), followed by patterning (see FIG. 2m). As in the case of FIG. 2n, dry etching or solvent etching may be used for patterning. Thereafter, the exposed portions in the insulation layer 2' are etched with an acid to prepare an insulation layer having a desired shape (see FIG. 2n). In this step, the Cu layer 6 functions as an over-etching preventing layer, which prevents any damage to the wiring 5 and insulation layer 2 of the first layer. Thereafter, a film of a superconductive material or a film 5' of a composition having the composition thereof is formed in the same manner as that of FIG. 2f (see FIG. 2o), and the lift-off layer 3' and layers provided thereover are removed by lift-off process or the like, thereby preparing a board having excellent flatness (see FIG. 2p). In the final step, the board is annealed in an atmosphere containing oxygen to oxidize the Cu layer 6 used as the over-etching preventing layer and, at the same time, to promote the reaction, thereby preparing a wiring board in which superconductive layers are electrically connected to each other (see FIG. 2q). In the above-described steps, the lift-off layers 3 and 3' and acid-resistant resist layers 4 and 4' may be the same material as far as the requirements for characteristics are met. Alternatively, a single layer having a combination of lift-off properties with acid-resistant properties may also be used. Further, in the annealing in the final step, a fluorine gas, an ammonium fluoride vapor, or the like may be introduced to prepare partially fluorinated superconductive layers 5 and 5'. A multi-layered wiring board having two or more wiring layers can be formed by repeating the steps shown in FIGS. 2h to 2q.

The third example of the present invention will now be described with reference to FIGS. 3a to 3r.

Figure 3B:
Figure 3C:
Figure 3D:
Figure 3E:
Figure 3F:
Figure 3G:
Figure 3H:
Figure 3I:
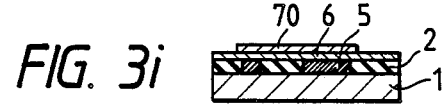
Figure 3J:
Figure 3K:
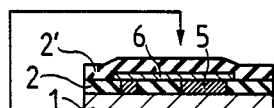
Figure 3L:
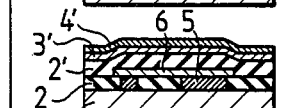
Figure 3M:
Figure 3N:

An insulation layer 2 which can be etched with an acid but is hardly etched with an alkali is formed on a substrate 1 (e.g., an oxide of at least one member selected from among the groups Ia and IIa elements, such as $Ba_4Y_2O_7$) by Ar sputtering (see FIG. 3b). Further, a lift-off layer 3 and an acid-resistant layer 4 are formed thereon (see FIG. 3c), followed by patterning by means of photolithography or the like (see FIG. 3d). The exposed portions of an insulation layer 2 are etched with an acid (see FIG. 3e), followed by formation of a superconductive material film or a film 5 having the composition of the superconductive material. It is preferred that the thickness of the film be equal to that of the insulation layer 2 (see FIG. 3f). The lift-off layer 3 is removed by lift-off process or the like, thereby preparing a flat board (see FIG. 3g). Then, a thin Cu layer 6 which functions as an over-etching preventing layer is formed (see FIG. 3h). Further, an alkaline-resistant resist 70 is formed thereon, followed by patterning (see FIG. 3i). Then, the Cu layer 6 is subjected to selective etching with an alkaline etching solution (e.g., an etching solution comprising 30 g/l of $NH_4ClO_2$, 100 g/l of $NH_4Cl$, 30 g/l of $(NH_4)_2CO_3$, and 150 ml/l of aqueous ammonia) (see FIG. 3j). Thereafter, a second insulation layer 2' is formed (see FIG. 3k), and a lift-off layer 3' and an acid-resistant layer 4' are further formed thereon (see FIG. 3l), followed by patterning (see FIG. 3m). As in the case of FIG. 1n, dry etching or solvent etching may be used for patterning. Thereafter, the exposed portions in the insulation layer 2' are etched with an acid to prepare an insulation layer having a desired shape (see FIG. 3n). In this step, the Cu layer 6 functions as an over-etching preventing layer, which prevents any damage to the wiring 5 and insulation layer 2 of the first layer.

Figure 3O:
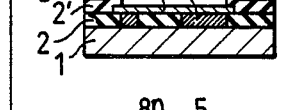
Figure 3P:
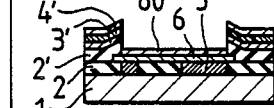
Figure 3Q:
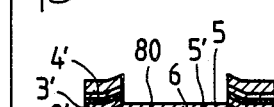
Figure 3R:
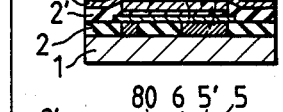

Thereafter, e.g., a thin film comprising at least one member selected from among the elements constituting a superconductive material except for Cu, such as $Ba_4Y_2O_7$, is formed as a reactive layer 80 which is reacted with the Cu layer 6 to form a superconductive material (see FIG. 3o). In this case, the reactive layer 80 may be a thin film of a superconductive material having a composition deficient in Cu or a thin film of a precursor thereof. Further, in order to promote conversion of the Cu layer 6 into a superconductive layer, the Cu layer 6 may be previously oxidized by thermal oxidation or with an oxygen plasma prior to the formation of the reactive layer 80. Thereafter, a film of a superconductive material or a film 5' having a composition of the superconductive material is formed in the same manner as that of FIG. 3f (see FIG. 3p). The lift-off layer 3' and subsequent layers are removed by lift-off process or the like to prepare a board having excellent flatness (FIG. 3q). In the final step, the board is annealed in an atmosphere containing oxygen to oxidize the Cu layer 6 used as the over-etching preventing layer and, at the same time, to promote the reaction with the reactive layer 80, thereby preparing a wiring board in which superconductive layers are electrically connected to each other (see FIG. 3r). In the above-described steps, the lift-off layers 3 and 3' and acid-resistant resist layers 4 and 4' may be the same material as far as the requirements for characteristics are met. Alternatively, a single layer having a combination of lift-off properties with acid-resistant properties may also be used. Further, in the annealing in the final step, a fluorine gas, an ammonium fluoride vapor, or the like may be introduced to prepare partially fluorinated superconductive layers 5 and 5'. A multi-layered wiring board having two or more wiring layers can be formed by repeating the steps shown in FIGS. 3h to 3r.

According to the present invention, it is possible to form wiring by making use of a superconductive material.

What is claimed is:

1. A process for preparing a superconductive wiring board comprising insulation layers and wiring layers composed of a superconductive material containing Cu, comprising steps of:
    forming a first layer containing a first insulation layer and a first superconductive wiring layer;
    forming on said first layer an over-etching preventing layer made of a thin metallic film composed of a group Ib element at portions corresponding to predetermined etching portions of a second insulation layer;
    forming said second insulation layer; and
    etching the predetermined portions of said second insulation layer so that the etching in the direction of depth reaches said thin metallic film and stops thereat to thereby increase the deterioration in characteristics of said superconductive wiring layer from touching an etching solution.

2. A process for preparing a superconductive wiring board according to claim 1, wherein said insulation layers comprise an inorganic material soluble in an acid and having high electrical resistance.

3. A process for preparing a superconductive wiring board according to claim 1, wherein said over-etching preventing layer is made of a thin metallic film composed of Cu or Ag, and said process further comprises oxidizing said over-etching preventing layer and subjecting the resulting oxide to selective etching to conduct patterning of said over-etching preventing layer.

4. A process for preparing a superconductive wiring board according to claim 1, wherein an alkaline etching solution of a group Ib element is used to conduct patterning of said over-etching preventing layer.

5. A process for preparing a superconductive wiring board according to claim 3, wherein said over-etching preventing layer is made of a thin metallic film composed of Cu, and said process further comprises forming, thereon, a thin film comprising at least one member selected from among elements constituting a superconductive material except for Cu, or a thin film comprising a superconductive material having a composition deficient in Cu or a precursor thereof, and oxidizing said thin film layer including said over-etching preventing layer to convert said thin film layer into a superconductive material, thereby preventing deterioration of characteristics due to slippage of the superconductive material composition by virtue of the presence of said over-etching preventing layer between wiring layers.

6. A process for preparing a superconductive wiring board according to claim 4, wherein said over-etching preventing layer is made of a thin metallic film composed of Cu, and said process further comprises forming, thereon, a thin film comprising at least one member selected from elements constituting a superconductive material except for Cu, or a thin film comprising a superconductive material having a composition deficient in Cu or a precursor thereof, and oxidizing said thin film layer including said over-etching preventing layer to convert said thin film layer into a superconductive material, thereby preventing deterioration of characteristics due to slippage of the superconductive material composition by virtue of the presence of said over-etching preventing layer between wiring layers.

7. A process for preparing a superconductive wiring board according to claim 1, wherein said insulation layers comprise at least one member selected from among groups Ia and IIa elements 8. A process for preparing a superconductive wiring board according to claim 1, wherein said over-etching preventing layer is later oxidized to convert said over-etching preventing layer into a superconductive material by a reaction, thereby preventing the breaking of wire attributed to slippage of the upper and lower layers.

* * * * *

UNITED STATES PATENT AND TRADEMARK OFFICE
CERTIFICATE OF CORRECTION

PATENT NO. : 4,913,769

DATED : April 3, 1990

INVENTOR(S) : Naoya Kanda, et al.

It is certified that error appears in the above-identified patent and that said Letters Patent is hereby corrected as shown below:

Claim 1, column 7, line 37, delete "increase" and insert therefor --decrease--.

Signed and Sealed this

Nineteenth Day of March, 1991

Attest:

HARRY F. MANBECK, JR.

*Attesting Officer*      *Commissioner of Patents and Trademarks*